US008922463B2

(12) United States Patent
Noh et al.

(10) Patent No.: US 8,922,463 B2
(45) Date of Patent: Dec. 30, 2014

(54) ORGANIC LIGHT-EMITTING DISPLAY APPARATUS

(75) Inventors: Sok Won Noh, Yongin (KR); Tae-Min Kang, Yongin (KR); Jae-Ho Lee, Yongin (KR); Jin-Won Sun, Yongin (KR); Min-Chul Suh, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 96 days.

(21) Appl. No.: 13/090,218

(22) Filed: Apr. 19, 2011

(65) Prior Publication Data
US 2011/0260954 A1 Oct. 27, 2011

(30) Foreign Application Priority Data

Apr. 26, 2010 (KR) .................. 10-2010-0038531
Mar. 31, 2011 (KR) .................. 10-2011-0029857

(51) Int. Cl.
*G09G 3/30* (2006.01)
*H01L 27/32* (2006.01)

(52) U.S. Cl.
CPC ....... *H01L 27/3246* (2013.01); *H01L 2251/558* (2013.01); *H01L 27/3248* (2013.01)
USPC .............................. 345/76; 345/87

(58) Field of Classification Search
USPC ............ 345/76–102, 204, 214, 690; 313/238, 313/257, 268; 315/169.1, 169.3
See application file for complete search history.

(56) References Cited

U.S. PATENT DOCUMENTS 6,420,834 B2 * 7/2002 Yamazaki et al. ......... 315/169.3
7,579,040 B2 * 8/2009 Lee et al. ...................... 427/66
7,592,620 B2 * 9/2009 Kim ............................... 257/40
7,687,983 B2 * 3/2010 Lee et al. ...................... 313/503
8,093,603 B2 * 1/2012 Jung et al. ....................... 257/88

(Continued)

FOREIGN PATENT DOCUMENTS

CN 1753589 A 3/2006
JP 09-325367 12/1997

(Continued)

OTHER PUBLICATIONS

European Office action dated Mar. 15, 2012, for corresponding European Patent application 11163504.1 (4 pages).

(Continued)

*Primary Examiner* — William Boddie
*Assistant Examiner* — Mansour M Said
(74) *Attorney, Agent, or Firm* — Christie, Parker & Hale, LLP

(57) ABSTRACT

An organic light-emitting display apparatus includes: a plurality of thin film transistors (TFTs); a planarization layer covering the plurality of TFTs; a plurality of pixel electrodes formed on the planarization layer, each of the pixel electrodes being connected to a corresponding one of the plurality of TFTs using a via-hole passing through the planarization layer and having a light-emitting portion and a non-emitting portion, and each of the via-holes being located at a point farthest from each of the light-emitting portions surrounding the via-hole; a pixel defining layer formed on the planarization layer to respectively cover each of the via-holes and the non-emitting portions; organic layers, each organic layer including an emission layer and being disposed in a corresponding one of the light-emitting portions; and a counter electrode disposed on each of the organic layers.

10 Claims, 4 Drawing Sheets

(56) References Cited

U.S. PATENT DOCUMENTS

| | | | |
|---|---|---|---|
| 8,143,782 B2* | 3/2012 | Kim | 313/506 |
| 8,164,252 B2* | 4/2012 | Lee et al. | 313/504 |
| 2002/0019092 A1 | 2/2002 | Arita et al. | |
| 2002/0190924 A1* | 12/2002 | Asano et al. | 345/55 |
| 2004/0141098 A1* | 7/2004 | Suzuki et al. | 349/42 |
| 2004/0178722 A1* | 9/2004 | Cok et al. | 313/506 |
| 2005/0048706 A1 | 3/2005 | Shimomura et al. | |
| 2005/0110028 A1 | 5/2005 | Park et al. | |
| 2006/0082292 A1 | 4/2006 | Kang et al. | |
| 2007/0069640 A1* | 3/2007 | Okunaka et al. | 313/504 |

FOREIGN PATENT DOCUMENTS

| | | |
|---|---|---|
| JP | 2005-101553 | 4/2005 |
| JP | 2006-114498 A | 4/2006 |
| JP | 2006-337713 A | 12/2006 |
| JP | 2009-199868 A | 9/2009 |
| JP | 2010-080340 | 4/2010 |
| KR | 2002-0054850 | 7/2002 |
| KR | 10-2005-0050494 A | 5/2005 |
| KR | 10-2005-0105852 A | 11/2005 |
| KR | 10-2008-0047777 A | 5/2008 |

OTHER PUBLICATIONS

Japanese Patent Office action dated Feb. 21, 2012 issued in the Japanese Patent Application No. 2011-003308, 2 pgs.

Registration Determination Certificate dated Feb. 1, 2013, issued in Korean Patent Application No. 10-2011-0029857, 5 pages.

JPO Decision to Dismiss Amendment dated Apr. 30, 2014, for corresponding Japanese Patent application 2012-243652, ( 2 pages).

JPO Decision of Refusal dated Apr. 30, 2014, for corresponding Japanese Patent application 2012-243652, ( 1 page).

SIPO Office action dated Jul. 2, 2014, for corresponding Chinese Patent application 201110112500.0, (10 pages).

* cited by examiner

ORGANIC LIGHT-EMITTING DISPLAY APPARATUS

CROSS-REFERENCE TO RELATED APPLICATION

This application claims the benefit of Korean Patent Application No. 10-2010-0038531, filed Apr. 26, 2010 and Korean Patent Application No. 10-2011-0029857, filed Mar. 31, 2011 in the Korean Intellectual Property Office, the disclosure of which is incorporated herein by reference.

BACKGROUND

1. Field

Aspects of the present invention relate to an organic light-emitting display apparatus, and more particularly, to an active matrix organic light-emitting display apparatus.

2. Description of the Related Art

Organic light-emitting display apparatuses are self-emitting display apparatuses that emit light by applying a voltage to an organic layer including a pixel electrode, a counter electrode, and an emission layer disposed between the pixel electrode and the counter electrode to cause electrons and holes to recombine with each other in the emission layer. Organic light-emitting display apparatuses have been spotlighted as the next generation display apparatuses because of their lighter and thinner design, wider viewing angle, faster response time, and lower power consumption compared to cathode ray tubes (CRTs) or liquid crystal displays (LCDs).

Organic light-emitting display apparatuses are classified into passive matrix (PM) organic light-emitting display apparatuses and active matrix (AM) organic light-emitting display apparatuses according to driving methods. Advantages of AM organic light-emitting display apparatuses include high resolution, high image quality, low power consumption, and long lifetime. In an AM organic light-emitting display apparatus, a thin film transistor (TFT) and a pixel electrode are electrically connected to each other through a via-hole. A pixel defining layer (PDL) defines a light-emitting area surrounding each pixel electrode.

SUMMARY

Aspects of the present invention provide an organic light-emitting display apparatus that improves display quality by preventing a pixel defining layer that surrounds an edge portion of a pixel electrode from falling down due to a via-hole formed near the pixel electrode.

According to an aspect of the present invention, there is provided an organic light-emitting display apparatus including: a plurality of thin film transistors (TFTs); a planarization layer covering the plurality of TFTs; a plurality of pixel electrodes formed on the planarization layer, each of the pixel electrodes being connected to a corresponding one of the plurality of TFTs using a via-hole passing through the planarization layer and having a light-emitting portion and a non-emitting portion, and each of the via-holes being located at a point farthest from each of the light-emitting portions surrounding the via-hole; a pixel defining layer formed on the planarization layer to respectively cover each of the via-holes and the non-emitting portions; organic layers, each organic layer including an emission layer and being disposed in a corresponding one of the light-emitting portions; and a counter electrode disposed on each of the organic layers.

According to an aspect of the present invention, the plurality of pixel electrodes may be patterned in a first direction and a second direction perpendicular to the first direction, and each of the plurality of via-holes may be formed at a position farthest from outer limits of the light-emitting portions of the plurality of pixel electrodes that are adjacent in the first direction and the second direction and disposed around the via-hole.

According to an aspect of the present invention, each of the plurality of via-holes may be formed at an intersection of first and second straight lines, the first straight line connecting central points between adjacent pairs of the light-emitting portions that are adjacent in the first direction and disposed around the via-hole and the second straight line connecting central points between adjacent pairs of the light-emitting portions that are adjacent in the second direction and disposed around the via-hole.

According to an aspect of the present invention, the first straight line and the second straight line may perpendicularly intersect each other.

According to an aspect of the present invention, each via-hole may be disposed substantially at a common point between diagonally adjacent pairs of the light-emitting portions.

According to an aspect of the present invention, the light-emitting portions may be arranged in a first grid pattern, and the via-holes may be arranged in a second grid pattern offset from the first grid pattern.

According to an aspect of the present invention, the light-emitting portions may be arranged in a first grid pattern, and the via-holes may be arranged in second grid pattern offset from the first grid pattern.

According to an aspect of the present invention, the light-emitting portions may not be disposed on a straight line formed by connecting adjacent via-holes.

According to an aspect of the present invention, relative to the substrate, a height of a portion of the pixel defining layer formed over each of the plurality of via-holes may be lower than a height of a portion of each of the pixel electrodes formed on the light-emitting portion.

According to an aspect of the present invention, a thickness of the pixel defining layer may be at or between 500 Å and 5000 Å.

According to an aspect of the present invention, the pixel defining layer may be substantially planar except at portions covering the via-holes.

According to an aspect of the present invention, via-hole connecting portions of the plurality of pixel electrodes may have the same pattern.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
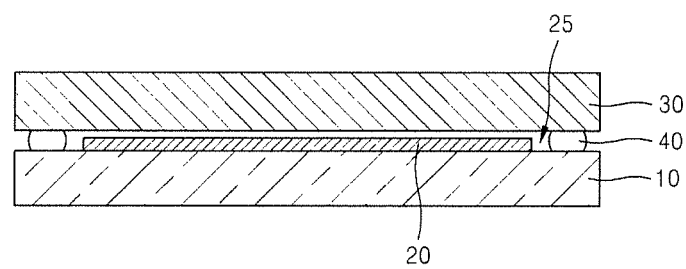
FIG. 1 is a cross-sectional view of an organic light-emitting display apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 is a cross-sectional view of an organic light-emitting display apparatus according to an embodiment of the present invention. Referring to FIG. 1, a display unit 20 is disposed on a substrate 10. An encapsulation substrate 30 is disposed on the substrate 10 and encapsulates the display unit 20. The encapsulation substrate 30 prevents external air and moisture from penetrating into the display unit 20.

The edges of the substrate 10 and the encapsulation substrate 30 are attached to each other by a sealing member 40 so that a space 25 between the substrate 10 and the encapsulation substrate 30 is sealed. A moisture absorbent, a filler, or the like may be filled in the space 25 as will be described later.

Figure 2:
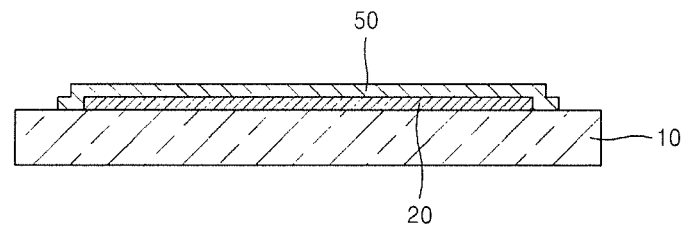
FIG. 2 is a cross-sectional view of an organic light-emitting display apparatus according to another embodiment of the present invention.

As shown in the embodiment in FIG. 2, instead of the encapsulation substrate 30 and the sealing member 40 as shown in the embodiment in FIG. 1, an encapsulation film 50 is formed on the display unit 20 to protect the display unit 20 from external air according to an aspect of the invention. The encapsulation film 50 is a thin film. The encapsulation film 50 may have a structure in which a layer formed of an inorganic material, such as silicon oxide or silicon nitride, and a layer formed of an organic material, such as epoxy or polyimide, are alternately formed. However, the present embodiment is not limited thereto and the encapsulation film 50 may have any structure as long as the encapsulation film 50 is a transparent thin film.

Figure 3:
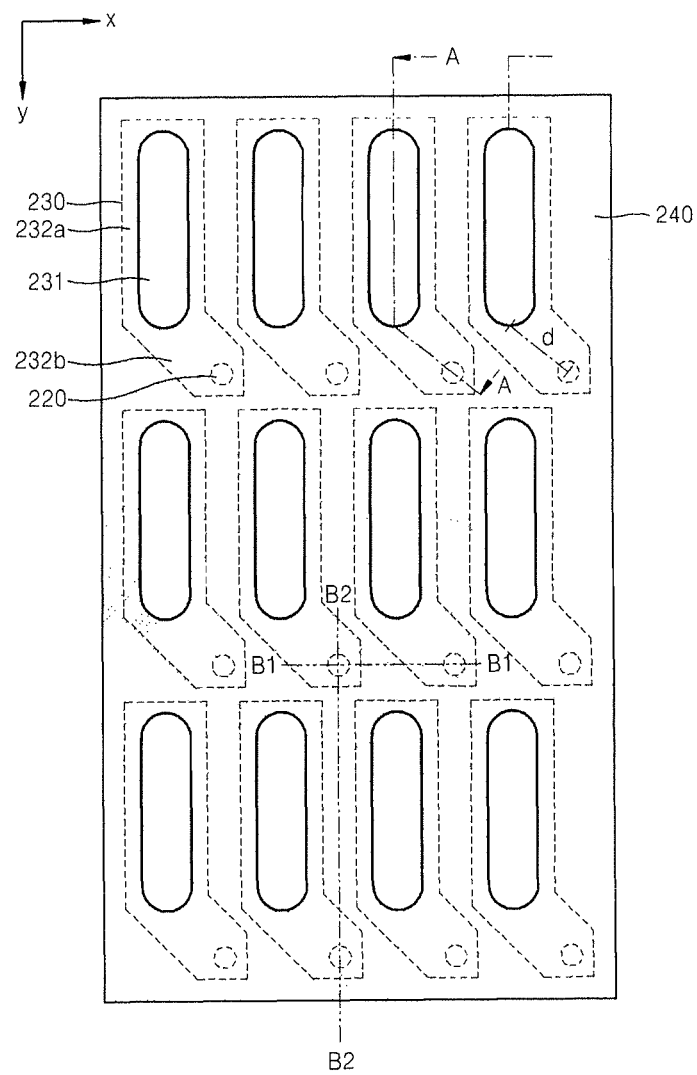
FIG. 3 is a plan view illustrating a display unit of the organic light-emitting display apparatus of FIG. 1 or 2.
Figure 4:
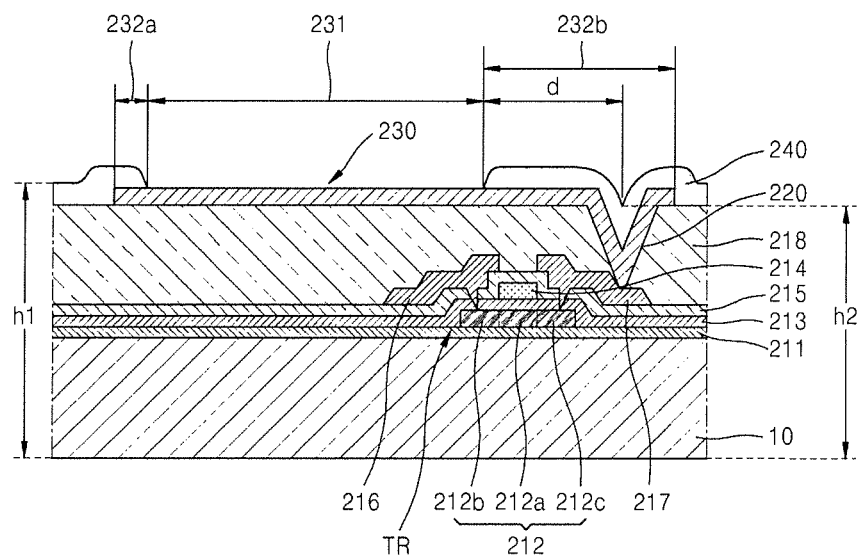
FIG. 4 is a cross-sectional view taken along line A-A of FIG. 3.
Figure 5:
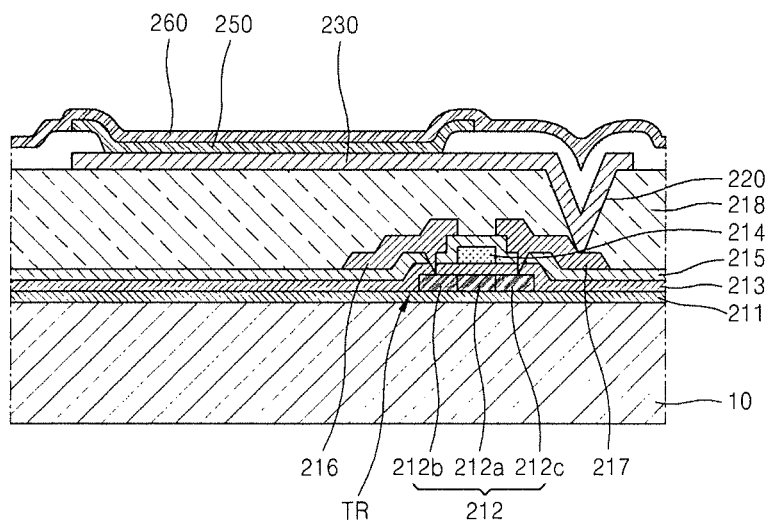
FIG. 5 is a cross-sectional view illustrating an organic layer and a counter electrode added to a pixel electrode of FIG. 4.
Figure 6:
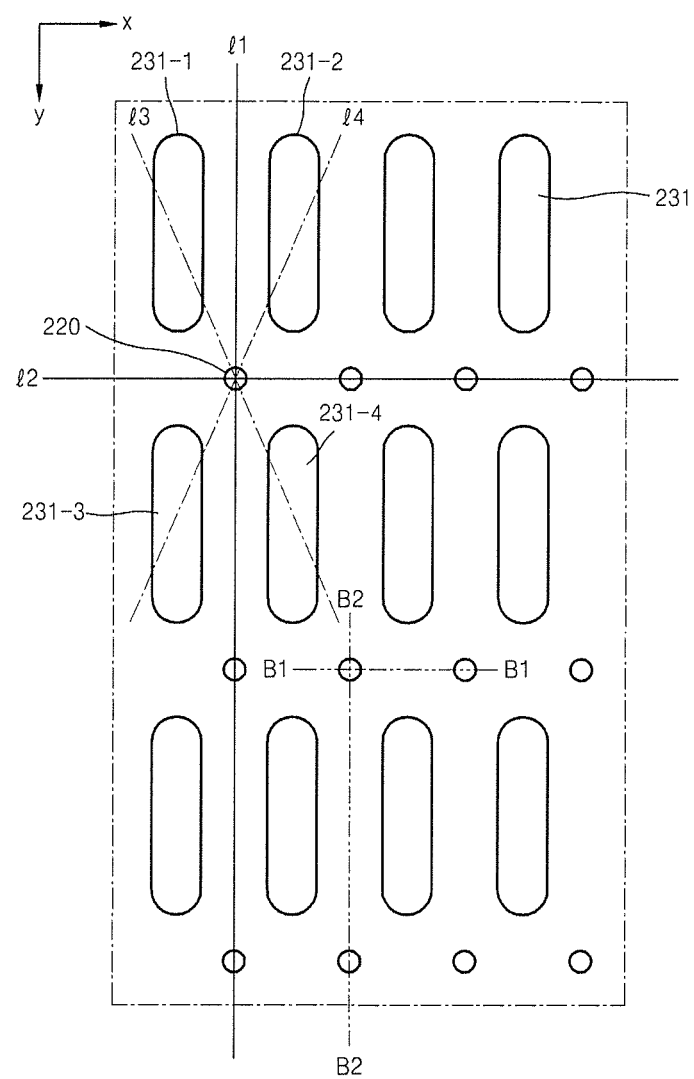
FIG. 6 is a plan view illustrating a positional relationship between a via-hole and a light-emitting portion of the pixel electrode of FIG. 3.

FIG. 3 is a plan view illustrating the display unit 20 of the organic light-emitting display apparatus FIG. 1 or FIG. 2 according to an aspect of the invention. FIG. 4 is a cross-sectional view taken along line A-A of FIG. 3. FIG. 5 is a cross-sectional view illustrating an organic layer 250 and a counter electrode 260 added to a pixel electrode of FIG. 4. FIG. 6 is a plan view illustrating a positional relationship between a via-hole 220 and a light-emitting portion 231 of the pixel electrode of FIG. 3.

Referring to FIGS. 3 through 6, a plurality of thin film transistors (TFTs) TRs are disposed on the substrate 10. The TFTs TRs are electrically connected to pixel electrodes 230 through the via-holes 220.

The substrate 10 may be formed of a transparent glass material including $SiO_2$ as a main component. Alternatively, the substrate 10 may be formed of an opaque material or a plastic material. However, the invention is not limited thereto.

A buffer layer 211 is formed on a top surface of the substrate 10. The TFTs TRs are formed on the buffer layer 211. The buffer layer 211 prevents the penetration of impurity elements and planarizes the top surface of the substrate 10. The buffer layer 211 may be formed of various materials. For example, the buffer layer 211 may be formed of an inorganic material, such as silicon oxide, silicon nitride, silicon oxynitride, aluminum oxide, aluminum nitride, titanium oxide, or titanium nitride, an organic material, such as polyimide, polyester, or acryl, or an organic-inorganic composite material thereof. The buffer layer 211 is not essential, and may be omitted if necessary.

Although only one driving TFT TR electrically connected to one of the pixel electrodes 230 is illustrated, this is for convenience of explanation. Although not illustrated in detail, a switching TFT, a capacitor, and the like may be further formed on the substrate 10. Also, various lines, such as scan lines, data lines, and driving lines, connected to the TFT and the capacitor may be further included in the organic light-emitting display apparatus.

A semiconductor active layer 212 is formed on the buffer layer 211. The semiconductor layer 212 may be formed of an inorganic semiconductor material such as amorphous silicon or polysilicon, but the present embodiment is not limited thereto and may be formed of an organic semiconductor material, an oxide semiconductor material, or the like. The semiconductor active layer 212 includes a source region 212b, a drain region 212c, and a channel region 212a disposed between the source region 212b and the drain region 212c.

A gate insulating layer 213 is formed on the buffer layer 211 to cover the semiconductor active layer 212. A gate electrode 214 is formed on the gate insulating layer 213. An interlayer insulating layer 215 is formed on the gate insulating layer 213 to cover the gate electrode 214. A source electrode 216 and a drain electrode 217 are formed on the interlayer insulating layer 215 and contact the source region 212b and the drain region 212c of the semiconductor active layer 212 through corresponding contact holes.

The structure of the TFT TR is not limited thereto, and the TFT TR may have various structures. For example, although the TFT TR has a top gate structure, the TFT TR may have a bottom gate structure in which the gate electrode 214 is formed under the semiconductor active layer 212. Of course, the TFT TR may have structures other than those described above.

A planarization layer 218 is formed to cover the TFTs TR. The planarization layer 218 reduces a height difference of the substrate 10 including the plurality of TFTs TR. The planarization layer 218 may be a single or multi-layered insulating layer having a flat top surface. The planarization layer 218 may be formed of at least one selected from the group consisting of polyimide, polyamide, acrylic resin, benzocyclobutene, and phenol resin.

Although not shown, a passivation layer may be further disposed on the source electrode 216 and the drain electrode 217.

Each of the via-holes 220 passes through the planarization layer 218 to expose the drain electrode 217 of each of the TFTs TR. Through the via-hole 220, each of the TFTs TR and each of the pixel electrodes 230 formed in a predetermined pattern on the planarization layer 218 are electrically connected to each other. Although the pixel electrode 230 is connected to the drain electrode 217 of the TFT TR in FIGS. 4 and 5, it is exemplary and the pixel electrode 230 may be electrically connected to the source electrode 216 through the via-hole 220.

The pixel electrode 230 includes the light-emitting portion 231 not covered by a pixel defining layer (PDL) 240, and a non-emitting portion 232 covered by the PDL 240. The non-emitting portion 232 may include a via-hole connecting portion 232b for connecting the light-emitting portion 231 and the via-hole 220, and a boundary portion 232a surrounding an edge of the light-emitting portion 231.

The PDL 240 is formed on the planarization layer 218 to cover the edge of the pixel electrode 230 electrically connected to the via-hole 220. The PDL 240 defines a pixel by covering the edge portion of the pixel electrode 230 to a predetermined thickness. Also, the PDL 240 prevents an arc from occurring at an end portion of the pixel electrode 230 by increasing a distance between the end portion of the pixel electrode 230 and the counter electrode 260, which will be explained later.

The organic layer 250 and the counter electrode 260 are sequentially formed on the pixel electrode 230. The organic layer 250 may be formed of a low or high molecular weight organic material. If the organic layer 250 is formed of a low molecular weight organic material, the organic layer 250 may be formed by stacking a hole injection layer (HIL), a hole transport layer (HTL), an emission layer (EML), an electron transport layer (ETL), and an electron injection layer (EIL) in a single or composite structure. Examples of the low molecular weight organic material may include copper phthalocyanine (CuPc), N,N'-Di(naphthalene-1-yl)-N,N'-diphenyl-benzidine (NPB), and tris-8-hydroxyquinoline aluminum (Alq3).

If the organic layer 250 is formed of a high molecular weight organic material, the organic layer 250 may include an HTL disposed on an EML toward the pixel electrode 230. The HTL may be formed of poly-(2,4)-ethylene-dihydroxy thiophene (PEDOT) or polyaniline (PANI). The EML is independently used for each of red, green, and blue pixels, and the HIL, the HTL, the ETL, and the EIL may be commonly used as common layers for red, green, and blue pixels.

Although the organic layer 250 is shown formed over only the pixel electrode 230 in FIG. 5, it is exemplary and the common layers may be formed to cover an entire pixel area, like the counter electrode 260. The organic layer 250 including the EML may have a color pattern that is formed by performing vacuum deposition, inkjet printing, spin coating, laser induced thermal imaging (LITI), or the like.

In particular, when a light-emitting material formed on a donor film is transferred to the pixel electrode 230 by using LITI, if the thickness of the PDL 240 surrounding the light-emitting portion 231 is high, the light-emitting material may not be smoothly transferred at the outer limit of the light-emitting portion 231 due to a great height difference between the light-emitting portion 231 and the PDL 240.

Even when the EML is not formed by using LITI, if the thickness of the PDL 240 is high, it is difficult to manufacture a thin display apparatus, which is currently increasingly in demand. In this regard, it is preferable that the thickness of the PDL 240 is as thin as possible.

When the thickness of the PDL 240 is low, if the via-hole 220 is formed too close to the edge portion of the pixel electrode 230 (i.e., too close to the outer limit of the light-emitting portion 231 of the pixel electrode 230), the PDL 240 formed on the pixel electrode 230 may sink into the via-hole 220 due to the proximity of the via-hole 220, thereby failing to maintain its thickness. Accordingly, the outer limit of the light-emitting portion 231 of the pixel electrode 230 becomes unclear, thereby reducing the overall flatness of the pixel. As a result, if the pattern for the EML is formed by LITI, vacuum deposition, or the like, the outer limit of the pattern for the EML becomes unclear, thereby lowering display quality.

To solve this problem, according to the organic light-emitting display apparatus of the present embodiment, the via-hole 220 is formed at a position farthest from the outer limit of the light-emitting portion 231 of the pixel electrode 230 formed near and around the via-hole 220.

FIG. 6 is a plan view illustrating a positional relationship between light-emitting portions 231-1, 231-2, 231-3, . . . of the pixel electrodes 230 and the via-holes 220. PDLs 240 and pixel defining layer forming portions surrounded by the PDLs 240 are not shown in FIG. 6. Referring to FIGS. 3 and 6, the via-holes 220 are formed at positions farthest from the light-emitting portions 231-1, 231-2, 231-3, . . . of the pixel electrodes 230 formed near and around the via-holes 220.

Specifically, if patterns for the light-emitting portions 231 of the pixel electrodes 230 are regularly arranged in a first direction (x direction) and a second direction (y direction) that perpendicularly intersects the first direction, each of the via-holes 220 may be formed at a position farthest from the outer limits of two light-emitting portions 231-1 and 231-3 that are adjacent in the second direction and disposed around a via-hole 220 and from the outer limits of two light-emitting portions 231-1 and 231-3 that are adjacent in the first direction and disposed around the via-hole 220.

As shown in FIG. 6, the via-hole 220 may be formed at an intersection of straight lines l1 and l2. The straight line l1 connects central points between the two light-emitting portions 231-1 and 231-2 that are adjacent in the first direction and disposed around the via-hole 220. The straight line l2 connects central points between the two light-emitting portions 231-1 and 231-3 that are adjacent in the second direction and disposed around the via-hole 220. In detail, the via-hole 220 may be formed at a perpendicular intersection between the straight line l1 and the straight line l2. Meanwhile, while shown as straight, it is understood that one or both of the lines t1 and t2 can be other than straight in other aspects, depending on the placement of the light-emitting portions 231-1, 231-2, 231-3.

Also, the via-hole 220 may be formed at an intersection of the light-emitting portions 231-1, 231-2, 231-3, and 231-4 which are diagonally adjacent and disposed around the via-hole 220. In detail, as shown in FIG. 6, the via-hole 220 may be formed at an intersection of straight lines n and M. The straight line l3 connects the two light-emitting portions 231-1 and 231-4 that are diagonally adjacent and disposed around the via-hole 220. The straight line l4 connects the two light-emitting portions 231-2 and 231-3 that are diagonally adjacent and disposed around the via-hole 220.

Also, referring to FIGS. 3 and 6, the light-emitting portion may be arranged in a first grid pattern, and the via-hole 220 may be arranged in a second grid pattern offset from the first grid pattern.

Referring to FIGS. 3 and 4, distances "d" between the via-holes 220 and the outer limits of the light-emitting portions 231 of the pixel electrodes 230 disposed near and around the via-holes 220 are constant, and are determined so that each of the via-holes 220 is farthest from the outer limit of an adjacent light-emitting portion 231.

Meanwhile, as shown in FIGS. 3 and 6, the light-emitting portions 231 of the pixel electrodes 230 are not disposed on a straight line B1-B1 formed by connecting each of the via-holes 220 and via-holes 220 that are adjacent to the corresponding via-hole 200 in the first direction, and are not disposed on a straight line B2-B2 formed by connecting each of the via-holes 220 and via-holes 220 that are adjacent to the corresponding via-hole 220 in the second direction, in order that each of the via-holes 220 is farthest from adjacent light-emitting portions 231.

Accordingly, even if the PDL 240 is thin and falls down into the via-hole 220, since the thickness of the PDL 240 at the outer limit of the light-emitting portion 231 is maintained, the light-emitting area may be clearly defined. As a result, if the pattern for the EML is formed by LITI, a vacuum deposition, or the like, the outer limit of the pattern for the EML may be clearly maintained, the flatness of the pixel may be substantially maintained, and display quality may be improved.

The thickness of the PDL 240 of the organic light-emitting display apparatus is low. For example, the thickness of the PDL 240 may be equal to or greater than 500 angstroms (Å) and equal to or less than 5000 Å. If the thickness of the PDL 240 is less than 500 Å, it is difficult to define the pixel, and if the thickness of the PDL 240 is greater than 5000 Å, smooth transfer of the EML by using LITI or the like may not be achieved due to a height difference between the PDL 240 and the light-emitting portion 231.

Referring to FIG. 4, since the thickness of the PDL 240 is low, a height "h2" between a bottom surface of the substrate 10 and a portion of the PDL 240 formed over the via-hole 220 is lower than a height "h1" between the bottom surface of the substrate 10 and a surface of the pixel electrode 230 formed on the light-emitting portion 231. This is because the PDL 240 which is relatively thin may not sufficiently fill a stepped portion formed in the via-hole 220. However, since the via-hole 220 is sufficiently far from the outer limit of the light-emitting portion 231 of the pixel electrode 230, although the portion of the PDL 240 formed over the via-hole 220 sinks and thus fails to maintain its thickness, the thickness of a portion of the PDL 240 formed at the outer limit of the light-emitting portion 231 that is spaced apart by the distance "d" from the via-hole 220 may be maintained.

The pixel electrode 230 of the organic light-emitting display apparatus may function as an anode and the counter electrode 260 may function as a cathode. Of course, polarities of the pixel electrode 230 and the counter electrode 260 may be reversed.

The pixel electrode 230 may be a reflective electrode, and the counter electrode 260 may be a transparent electrode. Accordingly, the display unit 20 is a top emission display unit in which an image is formed in a direction toward the counter electrode 260.

To this end, the pixel electrode 230 may include a reflective layer formed of at least one selected from the group consisting of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a compound thereof, and a material having a high work function such as indium tin oxide (ITO), indium zinc oxide (IZO), ZnO, or In2O3. The counter electrode 260 may be formed of a metal having a low work function such as Ag, Mg, Al, Pt, Pd, Au, Ni, Nd, Ir, Cr, Li, Ca, or an alloy thereof.

However, the present embodiment is not limited thereto, and the pixel electrode 230 may be a transparent electrode. In this case, the pixel electrode 230 may be formed of a material having a high work function, such as tin oxide (TO), IZO, ZnO, or In2O3, without including a reflective layer.

As described above, the organic light-emitting display apparatus according to aspects the present invention allows that, even if the thickness of a portion of a pixel defining layer formed near a via-hole is not maintained, the thickness of a portion of the pixel defining layer formed at the outer limit of a light-emitting portion may be maintained. Moreover, aspects allow a light-emitting area to be clearly defined. Also, aspects of the invention allow, when a pattern for an EML is formed by vacuum deposition, laser induced thermal imaging, or the like, display quality to be improved.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light-emitting display apparatus comprising:
a plurality of thin film transistors (TFTs);
a planarization layer covering the plurality of TFTs;
a plurality of pixel electrodes formed on the planarization layer, each of the pixel electrodes being connected to a corresponding one of the plurality of TFTs using a via-hole passing through the planarization layer and having a light-emitting portion and a non-emitting portion, and each of the via-holes being located at a point equidistant from all of the light-emitting portions diagonally adjacent and around the via-hole;
a pixel defining layer formed on the planarization layer to respectively cover each of the via-holes and the non-emitting portions;
organic layers, each organic layer comprising an emission layer and being disposed in a corresponding one of the light-emitting portions; and
a counter electrode disposed on each of the organic layers wherein the plurality of pixel electrodes are patterned in a first direction and a second direction perpendicular to the first direction, and each of the plurality of via-holes is formed at a position farthest from outer limits of the light-emitting portions of the plurality of pixel electrodes that are adjacent in the first direction and the second direction and disposed around the via-hole; wherein each of the plurality of via-holes is formed at an intersection of first and second straight lines, the first straight line connecting central points between adjacent pairs of the light-emitting portions that are adjacent in the first direction and disposed around the via-hole and the second straight line connecting central points between adjacent pairs of the light-emitting portions that are adjacent in the second direction and disposed around the via-hole.

2. The organic light-emitting display apparatus of claim 1, wherein the first straight line and the second straight line perpendicularly intersect each other.

3. The organic light-emitting display apparatus of claim 1, wherein each via-hole is disposed substantially at a common point between diagonally adjacent pairs of the light-emitting portions.

4. The organic light-emitting display apparatus of claim 3, wherein the light-emitting portions are arranged in a first grid pattern, and the via-holes are arranged in a second grid pattern offset from the first grid pattern.

5. The organic light-emitting display apparatus of claim 1, wherein the light-emitting portions are arranged in a first grid pattern, and the via-holes are arranged in second grid pattern offset from the first grid pattern.

6. An organic light-emitting display apparatus comprising:
a plurality of thin film transistors (TFTs);
a planarization layer covering the plurality of TFTs;
a plurality of pixel electrodes formed on the planarization layer, each of the pixel electrodes being connected to a corresponding one of the plurality of TFTs using a via-hole passing through the planarization layer and having a light-emitting portion and a non-emitting portion, and each of the via-holes being located at a point equidistant from each of the light-emitting portions diagonally adjacent and around the via-hole, wherein the light-emitting portions are not disposed on a straight line formed by connecting adjacent via-holes;

a pixel defining layer formed on the planarization layer to respectively cover each of the via-holes and the non-emitting portions;

organic layers, each organic layer comprising an emission layer and being disposed in a corresponding one of the light-emitting portions; and a counter electrode disposed on each of the organic layers.

7. The organic light-emitting display apparatus of claim 1, wherein, relative to a substrate, a height of a portion of the pixel defining layer formed over each of the plurality of via-holes is lower than a height of a portion of each of the pixel electrodes formed on the light-emitting portion.

8. The organic light-emitting display apparatus of claim 1, wherein a thickness of the pixel defining layer is at or between 500 Å and 5000 Å.

9. The organic light-emitting display apparatus of claim 1, wherein the pixel defining layer is substantially planar except at portions covering the via-holes.

10. The organic light-emitting display apparatus of claim 1, wherein via-hole connecting portions of the plurality of pixel electrodes have a same pattern.

* * * * *